United States Patent [19]

Weaver

[11] Patent Number: 4,760,283
[45] Date of Patent: Jul. 26, 1988

[54] DYNAMIC INPUT LATCH

[75] Inventor: Sam M. Weaver, Sherman, Tex.

[73] Assignee: Texas Instruments Incorporated, Dallas, Tex.

[21] Appl. No.: 124,449

[22] Filed: Nov. 17, 1987

Related U.S. Application Data

[63] Continuation of Ser. No. 901,926, Aug. 29, 1986.

[51] Int. Cl.$^4$ .............. H03K 17/16; H03K 17/08; H03K 17/687; H03K 19/094
[52] U.S. Cl. .................. 307/279; 307/443; 307/546; 307/554; 307/558
[58] Field of Search ......... 307/451, 452, 475, 481, 307/576, 579, 585, 272 A, 279, 542, 443, 546, 554, 557, 558, 568; 377/115, 116, 117, 127, 105, 68, 79

[56] References Cited

U.S. PATENT DOCUMENTS

| | | | |
|---|---|---|---|
| 3,904,888 | 9/1975 | Griffin et al. | 307/279 X |
| 3,947,829 | 3/1976 | Suzuki | 307/452 X |
| 3,989,955 | 11/1976 | Suzuki | 307/452 |
| 4,275,316 | 6/1981 | Knapp | 307/451 X |
| 4,506,164 | 3/1985 | Higuchi | 307/585 X |
| 4,554,467 | 11/1985 | Vaughn | 307/452 X |
| 4,568,842 | 2/1986 | Koike | 307/452 X |
| 4,587,665 | 5/1986 | Minakuchi | 377/121 X |
| 4,656,373 | 4/1987 | Plus | 307/451 X |

Primary Examiner—Stanley D. Miller
Assistant Examiner—David R. Bertelson
Attorney, Agent, or Firm—James T. Comfort; Leo N. Heiting; Melvin Sharp

[57] ABSTRACT

An output circuit (10) prevents the propagation of false signals caused by inductive voltages present at the power supply (Vcc) and ground (46) nodes by latching the input signal until the inductive voltages have dissipated. Inverting stages (28, 30 and 32) provide a predetermined time interval over which the input signal is latched.

15 Claims, 1 Drawing Sheet

U.S. Patent
Jul. 26, 1988
4,760,283
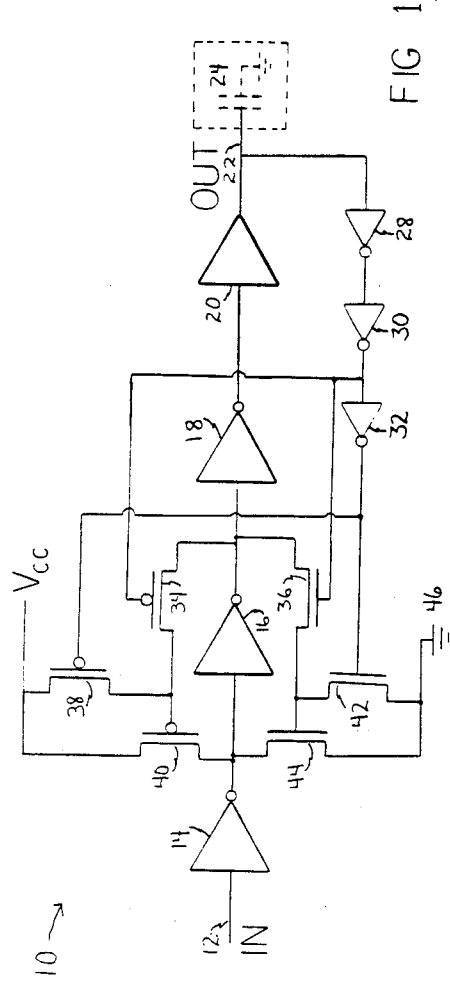
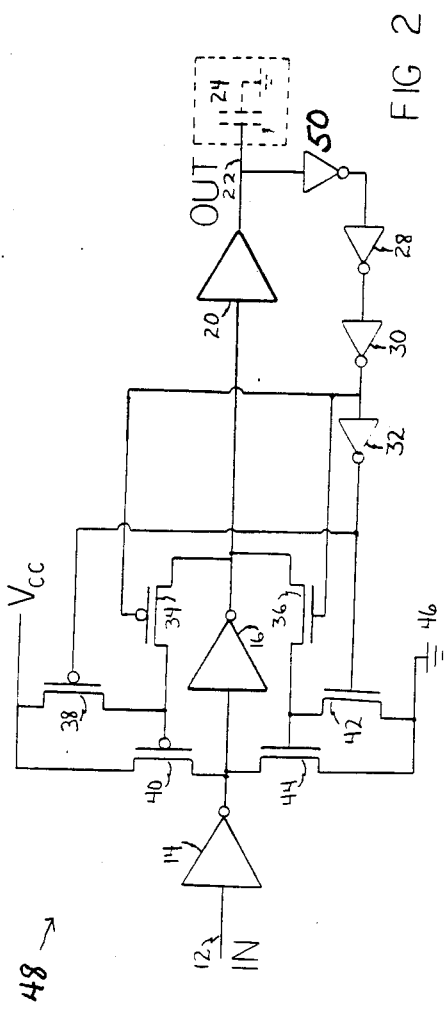

DYNAMIC INPUT LATCH

This application is a continuation, of application Ser. No. 901,926 filed Aug. 29, 1986.

TECHNICAL FIELD OF THE INVENTION

This invention pertains in general to integrated circuits, and more particularly to apparatus and methods for reducing the effect of the feedback of output voltage spikes.

BACKGROUND OF THE INVENTION

Advancement in integrated circuit technology has lead to vast improvements in the speed of integrated circuits, i.e. the time in which the output of a circuit reacts in response to a new input. Increasing integrated circuit speed has resulted in faster rise and fall times of the output voltages. Similarly, the fast rise and fall times of the output voltages have resulted in abrupt transitions of output current.

While faster speeds are very desirable, the abrupt transition of output currents has created serious problems. The package which holds an integrated circuit device has metallic leads which allow interconnection of the device on a circuit board. Each lead has a small inductance associated with it. The leads are connected to the integrated circuit using bonding wire, which also has an inductance associated with it. Voltage is related to inductance and the time rate of change of current by the equation $E=L \cdot dI/dT$, where L is the measure of inductance, and $dI/dT$ is the change in current with respect to time. The abrupt transition of output currents creates a large change of current at the ground and power supply leads and in the bonding wire, resulting in ground and power supply voltage spikes. These voltage spikes affect the output voltages of the device, and cause output ringing, ground bounce, and false signals.

Since the power supply and ground nodes are used as voltage references throughout an integrated circuit, variations caused by inductive voltages on the power supply and ground nodes affect signals within the integrated circuit. For instance, if the voltage level of the ground node rises, the input signal will appear to decrease. Thus, if a slowly rising input signal produces an output voltage transition as the input signal rises above the voltage threshold, the resulting inductive voltage on the ground node may result in an effective decrease in the input signal voltage. This behavior can cause false signals and oscillations within the integrated circuit.

Previous circuits have used hysteresis to counter the voltage variations of the input signal due to inductive voltages. In these circuits, the input signal has a voltage range over which it can vary without being recognized as a signal of the opposite polarity. However, with high-speed integrated circuits, the inductive voltage on the power supply and ground nodes can easily exceed a reasonable voltage range.

From the foregoing, it may be seen that a need has arisen for a technique which prevents propagation of false input signals caused by inductive voltage present at the power supply and ground nodes.

SUMMARY OF THE INVENTION

In accordance with the present invention, an integrated circuit is provided which prevents the propagation of false signals caused by inductive voltages present at the power supply and ground nodes of the integrated circuit by latching the input signal until the inductive voltages have subsided.

In accordance with another aspect of the invention, an output circuit is provided, having an input stage, an output stage, an intermediate stage, and a latching circuit. The latching circuit maintains a predetermined voltage level at the input of the intermediate stage for a predetermined time until the inductive voltages present at the power supply and ground nodes have dissipated.

In yet another aspect of the invention, the latching circuit provides a predetermined voltage level to the input of the intermediate stage after detecting a voltage change in the circuit.

In another aspect of the invention, the predetermined voltage is disconnected from the input of the intermediate stage after detection of a second voltage change in the circuit.

In another important aspect of the invention, the time during which the latch circuit provides a predetermined voltage to the input of the intermediate stage can be varied by increasing or decreasing the number of delay elements associated with the latching circuit.

BRIEF DESCRIPTION OF THE DRAWINGS

For a more complete understanding of the present invention and the advantages thereof, reference is now made to the following description in conjunction with the accompanying Drawings in which:

FIG. 1 illustrates a layout of the invention used in conjunction with a CMOS inverting output stage to eliminate false signals generated by inductive voltages present on the power supply and ground nodes; and FIG. 2 illustrates a layout of the invention used in conjunction with a CMOS non-inverting output stage to eliminate false signals generated by inductive voltages present on the power supply and ground nodes.

DETAILED DESCRIPTION OF THE INVENTION

The preferred embodiment of the present invention is best understood by referring to FIG. 1 of the Drawings, like numerals being used for like and corresponding parts of the various Drawings. FIG. 1 illustrates a circuit used to prevent oscillations in an inverting output stage by momentarily latching the input in the proper state until the power supply line spikes have dissipated.

A CMOS inverting stage is generally referred to by the reference number 10. An input 12 is connected to a first forward inverting stage 14. The first forward inverting stage 14 is connected to a second forward inverting stage 16, which is connected to a third forward inverting stage 18. The third forward inverting stage 18 is connected to a non-inverting stage 20. The non-inverting stage 20 provides the output 22 of the circuit. A capacitor 24 is shown in phantom to represent the capacitance of the circuitry connected to the output.

The output 22 is connected to three feedback inverting stages, 28, 30, and 32. The output of the second feedback inverting stage 30 is also connected to the gates of a first P-channel transistor 34 and a first N-channel transistor 36. The sources of the first P-channel transistor 34 and the first N-channel transistor 36 are connected to a node between the second forward inverting stage 16 and the third forward inverting stage 18. The drain of the first P-channel transistor 34 is connected to the drain of a second P-channel transistor 38 and the gate of a third P-channel transistor 40. The drain of the first N-channel transistor 36 is connected to the drain of a second N-channel transistor 42 and the gate of a third N-channel transistor 44. The gates of the second P-channel transistor 38 and second N-channel transistor 42 are connected to the output of the third feedback inverting stage 32. The sources of the second P-channel transistor 38 and second N-channel transistor 42 are connected Vcc and ground node 46, respectively. Similarly, the sources of the third P-channel transistor 40 and third N-channel transistor 44 are connected Vcc and ground node 46, respectively. The drains of the third P-channel transistor 40 and third N-channel transistor 44 are connected to the input of the second forward inverting stage 16.

As is known, a P-channel transistor conducts between source and drain when the gate voltage is negative with respect to the source voltage. Therefore, if the source is tied to Vcc, a P-channel transistor will conduct when a "low" signal is present at its gate and will not conduct when a "high" signal is present at its gate. Conversely, a N-channel transistor will conduct between source and drain when the gate voltage is positive with respect to the source voltage. Thus, if the source voltage of a N-channel transistor is tied to ground, it will conduct when a "high" signal is present at its gate, and will not conduct when a "low" signal is present at its gate. A transistor is "turned-on" if it is in a conducting (low impedance) state, and is "turned-off" if it is in a non-conducting (high-impedance) state.

In operation, the input receives an input signal, either from another integrated circuit or from another stage of the same integrated circuit. The first forward inverting stage 14 maintains its output voltage level until the input reaches a threshold voltage level. Assuming a low to high transition of the input signal, a slowly rising signal present at the input 12 is inverted by the first forward inverting stage 14 after reaching a voltage threshold (the level at which the first forward inverting stage 14 recognizes the input as being a "high" signal), thus producing a low signal at the output of the first forward inverting stage 14. The signal is inverted again by the second forward inverting stage 16, producing a high signal at the output of the second forward inverting stage 16. The third forward inverting stage 18 inverts the signal once again, producing a low signal at its output. After passing through the forward non-inverting stage 20, the low signal will appear at the output 22 as the inversion of the signal present at the input 12.

As the output 22 changes from a high signal to a low signal, the charge stored in the output circuitry capacitor 24 will flow to ground node 46, causing an inductive voltage to appear on the ground node 46. When multiple outputs are switching simultaneously, the current through the ground node 46 will be proportionally increased, resulting in a larger inductive voltage present at the ground node 46. Since the ground node 46 is the reference for all other voltages in the circuit, the voltage between input 12 and ground node 46 decreases due to the inductive voltage present at the ground node 46. If the inductive voltage present on the ground node 46 exceeds the rise in the input voltage during the propagation of the signal from input 12 to output 22, the input signal will appear to have switched from high to low. This is referred to as a "false" signal.

In previously developed circuits, the false signal could cause oscillations within the circuit as it propagated from input to output. Since the voltage at the input 12 would now appear to the first forward inverting stage 14 as a low signal, the first forward inverting stage 14 would output a high signal in response to its perceived new input. Consequently, after two subsequent inversions by the second and third forward inverting stages, a high signal would appear on the output 22. At this point, the inductive voltage on the ground node 46 reverses, and the input signal would once again appear as a high signal, resulting in yet another change in the output signal. In practice, the oscillations may occur indefinately in high speed CMOS devises. However, even if the oscillations occur for only a short period of time, the false signals make the devices unreliable for most applications.

The present invention prevents such oscillations from occurring by momentarily latching the input in a proper state, until all inductive voltage spikes have dissipated from the power supply and ground nodes. The operation of the circuit with respect to a low to high transition of the input signal is as follows. Prior to transition of the input signal, the signal present at the input is low, the signal at the output of the first forward inverting stage 14 is high, the signal at the output of the second forward inverting stage 16 is low, and the signal at the output of the third forward inverting stage 18 is high, as is the signal at the output 22. The signal at the output of the first feedback inverting stage 28 is low, the signal at the output of the second feedback inverting stage 30 is high, and the output at the third feedback inverting stage 32 is low. Since the signal at the output of the second feedback inverting stage 30 is high, the first N-channel transistor 36 is turned on; because the source of the first N-channel transistor 36 is connected to the output of the second forward inverting stage 16, the gate of the third N-channel transistor 44 is low, thus causing the third N-channel transistor 44 to be off. The second N-channel transistor 42 is also off since its gate is connected to the output of the third feedback inverting stage 32.

As the output slowly rises, the voltage threshold is reached, and the first forward inverting stage 12 recognizes the voltage present at the input 12 as a high signal. The first forward inverting stage 14 inverts the high signal and produces a low signal at its output, which is the input to the second forward inverting stage 16. The second forward inverting stage 16 inverts the low signal to a high signal at its output. Since the first N-channel transistor 36 is still turned on, it conducts the signal present at the output of the second forward inverting stage 16 to the gate of the third N-channel transistor 44. Thus, as the voltage present at the output of the second forward inverting stage 16 reaches the turn-on voltage of the third N-channel transistor 44, the third N-channel transistor 44 conducts from ground node 46 to the output of the first forward inverting stage 14, pulling it low. The signal continues to propagate from the output of the second forward inverting stage 16 through the third forward inverting stage 18 and the forward non-inverting stage 20. Therefore, the signal will reach the output 22 two gate delays after it appears at the output of the second forward inverting stage 16.

As the switching output causes an inductive voltage on the ground node 46, the input to the second forward inverting stage 16 will not be altered, since the third N-channel transistor 44 is pulling the input to the second forward inverting stage 16 to ground node 46. This prevents a false signal from propagating past the first forward inverting stage 14.

Once the inductive voltage on the ground node 46 dissipates, the third N-channel transistor 44 must be turned off to allow propagation of valid input signals from input 12 to output 22. The present invention resets the circuit as follows. The low signal present at the output 22 propagates through the three feedback stages 28, 30, and 32 providing a gate delay sufficient to allow the inductive voltage at the ground node 46 to dissipate. As the signal propagates through the feedback stages, the output of the second feedback inverting stage 30 switches from high to low, causing the first N-channel transistor 36 to turn off. Subsequently, the output of the third feedback inverting stage 32 switches from low to high, causing the second N-channel transistor 42 to turn on, resulting in the gate of the third N-channel transistor 44 being pulled low. At this point, the third N-channel transistor 44 is turned off, and the second forward inverting stage 16 is ready to receive new valid signals.

A similar circuit is used to prevent inductive voltages from affecting the input voltage during high to low transitions. The operation of the circuit with respect to a high to low transition of the input signal is as follows. Prior to transition of the input signal, the signal present at the input is high, the signal at the output of the first forward inverting stage 14 is low, the signal at the output of the second forward inverting stage 16 is high, and the signal at the output of the third forward inverting stage 18 is low, as is the signal at the output 22. The signal at the output of the first feedback inverting stage 28 is high, the signal at the output of the second feedback inverting stage 30 is low, and the output at the third feedback inverting stage 32 is high. Since the signal at the output of the second feedback inverting stage 30 is low, the first P-channel transistor 34 is turned on; because the source of the first P-channel transistor 34 is connected to the output of the second forward inverting stage 16, the gate of the third P-channel transistor 40 is high, thus causing the third P-channel transistor 40 to be off. The second P-channel transistor 38 is also off since its gate is connected to the output of the third feedback inverting stage 32.

As the output slowly falls, the voltage threshold is reached, and the first forward inverting stage 14 recognizes the voltage present at the input 12 as a low signal. The first forward inverting stage 14 inverts the low signal and produces a high signal at its output, which is the input to the second forward inverting stage 16. The second forward inverting stage 16 inverts the high signal to a low signal at its output. Since the first P-channel transistor 34 is still turned on, it conducts the signal present at the output of the second forward inverting stage 16 to the gate of the third P-channel transistor 40. Thus, as the voltage present at the output of the second forward inverting stage 16 reaches the turn-on voltage of the third P-channel transistor 40, the third P-channel transistor 40 conducts from Vcc to the output of the first forward inverting stage 14, pulling it high. The input signal continues to propagate from the output of the second forward inverting stage 16 through the third forward inverting stage 18 and the forward non-inverting stage 20. Therefore, the signal will reach the output 22 two gate delays after it appears at the output of the second forward inverting stage 16

As the switching output causes an inductive voltage on the Vcc node, the input to the second forward inverting stage 16 will not be altered, since the third P-channel transistor 40 is pulling the input to the second forward inverting stage 16 to Vcc. This prevents a false signal from propagating past the first forward inverting stage 14.

The present invention resets the circuit as follows. The high signal present at the output 22 propagates through the three feedback stages 28, 30, and 32 providing a gate delay sufficient to allow the inductive voltage at the Vcc node to dissipate. As the signal propagates through the feedback stages, the output of the second feedback inverting stage 30 switches from low to high, causing the first P-channel transistor 34 to turn off. Subsequently, the output of the third feedback inverting stage 32 switches from high to low, causing the second P-channel transistor 38 to turn on, resulting in the gate of the third P-channel transistor 40 being pulled high. At this point, the third P-channel transistor 40 is turned off, and the second forward inverting stage 16 is ready to receive new valid signals.

The time interval during which the input 12 is effectively disconnected from the output 22 may be varied by changing the number of feedback inverting stages, or alternatively, by varying the size of the feedback inverting stages, so that a greater delay is associated with each stage. In the illustrated embodiments, the delay elements operate on a change in voltage at the output 22; however, with minor modification, the delay elements could be connected to other nodes within the circuit with a similar result.

The amount of time delay used in a particular implimentation involves a trade off between the F max of the output (the maximum frequency at which the output can switch from a valid high signal to a valid low signal, and from a valid low signal to a valid high signal) and the minimum input rise and fall rates that the circuit will accommodate. A false signal will occur when the potential between the input signal and the ground node 46 is less than the high voltage threshold limit. Thus, in order to accommodate slowly rising signals, a longer latch time, and hence a longer delay, is necessary. However, since the output cannot switch while the input is latched, the F max of the circuit must be reduced in order to accommodate more slowly rising signals. Many applications will not involve slowly rising signals, in which case the circuit may be designed with a shorter latch time.

It should be noted that false signals may be generated by noise sources in the circuit other than inductive voltages at the power supply and ground nodes. The present invention serves to maintain a unvarying input signal for a predetermined time after an input signal change; therefore, much of the unwanted noise is blocked from propagating through the circuit.

Furthermore, it should be noted that although the input signal is latched at the input to the second forward inverting stage 16 in the illustrated embodiment, it would be possible to modify the circuit to latch the input signal at another point if desired.

FIG. 2 illustrates the invention used in connection with non-inverting output circuit. The non-inverting output circuit 48 is similar to the inverting output circuit 10 of FIG. 1, except that the third forward inverting stage 18 has been removed, and that an additional feedback inverting stage, the complimentary feedback inverting stage 50, has been added in order to provide the correct signals to the transistors 38–44.

A non-inverting output circuit has a problem similar to inverting output circuits with regard to inductive voltages present at the power supply and ground nodes. In a non-inverting output circuit, a high to low signal transition at the input causes a high to low signal transition at the output. The high to low signal transition at the output creates an inductive voltage at the ground node, as the ground node resists a change in current. This inductive voltage changes the reference point for voltages in the circuit, causing the input signal to appear lower. Since the input signal is changing from high to low, the inductive voltage does not create a false signal at the input. However, as the current from the output circuitry begins to decrease, the voltage on the ground node will reverse, as it once again attempts to resist a change in current flow. This occurance is known as "overshoot." The inductive voltage on the ground node caused by the overshoot results in an increase in the voltage differential between the input signal and the ground node, causing the input signal to appear higher. If the input signal appears to be greater than the high voltage threshold limit, a false signal will be present at the input.

As before, the invention prevents propagation of a false signal through the circuit by latching a valid signal at the input to the second forward inverting stage 16. In operation, the non-inverting output circuit 48 works as follows for a high to low transition of the input signal. Prior to transition of the input signal, the signal present at the input is high, the signal at the output of the first forward inverting stage 14 is low, the signal at the output of the second forward inverting stage 16 is high, as is the signal at the output 22. The signal at the output of the complimentary feedback inverting stage 50 is low, the output at the first feedback inverting stage 28 is high, the signal at the output of the second feedback inverting stage 30 is low, and the output at the third feedback inverting stage 32 is high. Since the signal at the output of the second feedback inverting stage 30 is low, the first P-channel transistor 34 is turned on; because the source of the first P-channel transistor 34 is connected to the output of the second forward inverting stage 16, the gate of the third P-channel transistor 40 is high, thus causing the third P-channel transistor 40 to be off. The second P-channel transistor 38 is also off since its gate is connected to the output of the third feedback inverting stage 32.

As the output slowly falls, the voltage threshold is reached, and the first forward inverting stage 14 recognizes the voltage present at the input 12 as a low signal. The first forward inverting stage 14 inverts the low signal and produces a high signal at its output, which is the input to the second forward inverting stage 16. The second forward inverting stage 16 inverts the high signal to a low signal at its output. Since the first P-channel transistor 34 is still turned on, it conducts the signal present at the output of the second forward inverting stage 16 to the gate of the third P-channel transistor 40. Thus, as the voltage present at the output of the second forward inverting stage 16 reaches the turn-on voltage of the third P-channel transistor 40, the third P-channel transistor 40 conducts from Vcc to the output of the first forward inverting stage 14, pulling it high. The input signal continues to propagate from the output of the second forward inverting stage 16 through the forward non-inverting stage 20. Therefore, the signal will reach the output 22 one gate delay after it appears at the output of the second forward inverting stage 16.

As the overshoot of the switching output causes a inductive voltage on the ground node, the input to the second forward inverting stage 16 will not be altered, since the third P-channel transistor 40 is pulling the input to the second forward inverting stage 16 to Vcc. This prevents a false signal from propagating past the first forward inverting stage 14.

The present invention resets the circuit as follows. The low signal present at the output 22 propagates through the four feedback stages 50, 28, 30, and 32 providing a gate delays sufficient to allow the overshoot inductive voltage at the ground node 46 to dissipate. As the signal propagates through the feedback stages, the output of the second feedback inverting stage 30 switches from low to high, causing the first P-channel transistor 34 to turn off. Subsequently, the output of the third feedback inverting stage 32 switches from high to low, causing the second P-channel transistor 38 to turn on, resulting in the gate of the third P-channel transistor 40 being pulled high. At this point, the third P-channel transistor 40 is turned off, and the second forward inverting stage 16 is ready to receive new valid signals.

The operation of the non-inverting output circuit 48 with respect to a low to high input signal transition will not be discussed herein, as the operation can be readily discerned from the previous discussion.

As noted above, the latch time may be adjusted as necessary to prevent false signals. To reiterate, the latch time will be a designer's choice between increasing F max and accomodating slowly rising input signals.

Thus, the present invention provides advantages as discussed above, as well as numerous other advantages. As will be apparent to those skilled in the art, the present invention can be widely modified and varied. The scope of the invention is not limited, except as set forth in the accompanying claims.

TECHNICAL ADVANTAGES

It is a technical advantage of the invention that false signals caused by inductive voltage spikes present in the power supply and ground nodes of a integrated circuit are prevented by latching a valid signal until the inductive voltages have sufficiently subsided. It is a further technical advantage that the latch time of the invention can be easily modified for use in varying applications.

It is yet a further advantage that the invention can be implemented in both inverting and non-inverting output circuits. In yet another technical advantage, the circuit can be used in conjuction with CMOS and other transistor technologies.

What is claimed is:

1. A integrated circuit having power supply and ground nodes comprising:
    (a) an input stage for receiving digital input signals;
    (b) an output stage for transmitting output signals;
    (c) an intermediate stage coupled between said input and output stages for transforming input signals into desirable output signals; and
    (d) a latching circuit for use with an input signal having two states, operable upon a transition to a first state, providing a first predetermined voltage level at the input of said intermediate stage for a predetermined time, and, upon transition to a second state, providing a second predetermined voltage at the input to the intermediate stage for said predetermined time wherein said predetermined time is less than the time between transition of the input signal states.

2. The circuit of claim 1 wherein said latching circuit maintains said first predetermined voltage level by engaging a switch between at least one reference voltage source and said input to said intermediate stage.

3. The circuit of claim 1 wherein said latching circuit maintains said second predetermined voltage level by engaging a switch between at least one ground node and said input to said intermediate stage.

4. The circuit of claim 1 wherein said latching circuit detects a change in voltage from said output stage.

5. A circuit having power supply and ground nodes comprising:
   (a) an input stage for receiving digital signals from outside sources;
   (b) an output stage for transmitting output signals,
   (c) a plurality of inverting and non-inverting stages disposed between said input stage and said output stage; and
   (d) a latching circuit for use with an input signal having two states, operable upon an input signal transition to a first state, to provide a first determined voltage to a selected input of one of said inverting or non inverting stages for a predetermined time interval, and upon transition of said input signal to a second state to provide a second predetermined voltage to said selected input for said predetermined time interval wherein said predetermined time interval is less than the time between transitions of said input signal states.

6. The circuit of claim 5 wherein said latching circuit maintains said first predetermined voltage level by engaging a switch between at least one reference voltage source and said input to said intermediate stage.

7. The circuit of claim 5 wherein said latching circuit maintains said second predetermined voltage level by engaging a switch between at least one ground node and said input to said intermediate stage.

8. The circuit of claim 5 wherein said latching circuit detects a change in voltage from said output stage.

9. An output circuit comprising:
   an input stage for receiving input signals;
   an output stage for transmitting output signals;
   first and second inverting stages serially diposed between said input stage and said output stage;
   a voltage sensing device disposed after said second inverting stage;
   a switching device disposed between a predetermined voltage source and the input to said second inverting stage, said switching device enabling a flow of charge between the voltage source and said input stage to said second inverting stage upon detection of a voltage change by said voltage sensing device; and
   a disabling device disposed between said output stage and said switching device, said disabling device operable for disabling the flow of charge between the predetermined voltage source and said input stage to said second inverting stage after a predetermined time interval has elapsed since a change in the output signal.

10. The output circuit of claim 9 wherein said voltage sensing device is a first transistor with its source connected to the output of the second inverting stage and its drain connected to the switching device.

11. The output circuit of claim 10 wherein said voltage sensing device further comprises a plurality of delay devices connected between said output stage and said first transistor.

12. The output circuit of claim 10 wherein said switching device comprises a second transistor, said second transistor having its source connected to said predetermined voltage source and having its drain connected to the input to said second inverting stage.

13. The output circuit of claim 12 wherein said second transistor has its gate connected to said voltage sensing device.

14. The output circuit of claim 12 wherein said disabling device comprises a third transistor, said third transistor having its source connected to said predetermined voltage source and having its drain connected to the switching device.

15. The output circuit of claim 14 wherein said disabling device further comprises a plurality of delay devices disposed between said output stage and said third transistor.

* * * * *